(12) United States Patent
Dutta et al.

(10) Patent No.: US 7,273,776 B2
(45) Date of Patent: Sep. 25, 2007

(54) METHODS OF FORMING A P-WELL IN AN INTEGRATED CIRCUIT DEVICE

(75) Inventors: Ranadeep Dutta, Austin, TX (US); Frank L. Thiel, Austin, TX (US)

(73) Assignee: Legerity, Inc., Austin, TX (US)

( * ) Notice: Subject to any disclaimer, the term of this patent is extended or adjusted under 35 U.S.C. 154(b) by 384 days.

(21) Appl. No.: 10/899,596

(22) Filed: Jul. 27, 2004

(65) Prior Publication Data

US 2006/0024927 A1     Feb. 2, 2006

(51) Int. Cl.
*H01L 21/8238* (2006.01)
(52) U.S. Cl. ............... 438/224; 438/228; 257/E21.63; 257/E21.644
(58) Field of Classification Search ............... 438/224, 438/228, 204, 336, 222, 226, 227, 223; 257/E21.63, 257/E21.644
See application file for complete search history.

(56) References Cited

U.S. PATENT DOCUMENTS 6,309,945 B1 *  10/2001  Sato et al. ............... 438/409
6,692,982 B2 *  2/2004   Takahashi et al. .......... 438/69

* cited by examiner

*Primary Examiner*—Thanhha S. Pham
(74) *Attorney, Agent, or Firm*—Williams, Morgan & Amerson, P.C.

(57) ABSTRACT

The present invention is generally directed to a method of forming a p-well in an integrated circuit device. In one illustrative embodiment, the method comprises forming a first layer of epitaxial material above an active layer of a substrate, forming a first doped region in the first layer of epitaxial material, forming a second layer of epitaxial material above the first layer of epitaxial material, forming a second doped region in the second layer of epitaxial material, and performing at least one heat treating process.

26 Claims, 8 Drawing Sheets

METHODS OF FORMING A P-WELL IN AN INTEGRATED CIRCUIT DEVICE

BACKGROUND OF THE INVENTION

1. Field of the Invention

This invention is generally related to the field of semiconductor devices, and, more particularly, to various methods of forming a P-well in an integrated circuit device.

2. Description of the Related Art

In some environments, modern integrated circuit devices are designed to operate in high voltage environments, e.g., 80-250 volts. One illustrative example of such a high voltage application would be integrated circuits on subscriber line interface cards (SLIC) which are in widespread use in modern telecommunication systems. In some cases, the circuits on such devices are comprised of complementary bipolar transistors, i.e., NPN and PNP bi-polar transistors.

Typically, such bi-polar transistors are formed above a silicon-on-insulator (SOI) structure. Initially, the process involves forming a relatively thick layer of epitaxial silicon, e.g., 12-30 microns, above the active layer of the SOI structure. In forming the PNP bi-polar transistor, a P-well must be formed in the epitaxial layer of silicon. Traditionally, in forming such a P-well structure, two ion implantation processes have been performed. The first ion implantation process is performed using aluminum as a dopant material, whereas the second ion implantation process is performed using boron as a dopant material. Aluminum is employed in such structures due to its increased diffusivity characteristics as compared to, for example, boron. Such increased diffusivity is necessary such that the dopant material extends throughout the relatively thick epitaxial silicon layer. More specifically, aluminum is employed in forming a P-well to ensure that the dopant reaches the $P^+$ buried layer formed in the active layer of the SOI structure.

However, the use of the aluminum dopant material has several drawbacks. For example, the use of aluminum leads to increased process variability in parameters such as breakdown voltage, early voltage and quasi saturation. Moreover, the use of a metal such as aluminum can lead to increased leakage currents as the metallic dopant atoms occupy defect sites within the epitaxial silicon layer. The use of aluminum, or other metallic dopants, may also increase the risk of contaminating other areas of the integrated circuit device with aluminum. Thus, there is a need for an improved methodology of forming P-well regions in high voltage devices having relatively thick layers of epitaxial silicon without using aluminum as the dopant material.

The present invention is directed to various methods that may solve, or at least reduce, some or all of the aforementioned problems.

SUMMARY OF THE INVENTION

The present invention is generally directed to various methods of forming a P-well in an integrated circuit device. In one illustrative embodiment, the method comprises forming a first layer of epitaxial material above an active layer of a substrate, forming a first doped region in the first layer of epitaxial material, forming a second layer of epitaxial material above the first layer of epitaxial material, forming a second doped region in the second layer of epitaxial material, and performing at least one heat treating process.

In another illustrative embodiment, the method comprises forming a first layer of epitaxial silicon above an active layer of a silicon-on-insulator structure, forming a first doped region in the first layer of epitaxial silicon, forming a second layer of epitaxial silicon above the first layer of epitaxial silicon, forming a second doped region in the second layer of epitaxial silicon, and performing at least one heat treating process.

In yet another illustrative embodiment, the method comprises forming a first layer of epitaxial silicon above an active layer of a silicon-on-insulator structure, performing a first ion implantation process to form a first doped region in the first layer of epitaxial silicon, forming a second layer of epitaxial silicon above the first layer of epitaxial silicon, performing a second ion implantation process to form a second doped region in the second layer of epitaxial silicon, and performing at least one heat treating process.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various layers, doped regions and structures of the semiconductor devices are depicted in the drawings as having very precise, sharp configurations and profiles, those skilled in the art recognize that, in reality, these regions and structures may not be as precise as indicated in the drawings. Additionally, the relative sizes of the various features, regions and layers depicted in the drawings may be exaggerated or reduced as compared to the size of those features, regions or layers on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of forming a P-well in an integrated circuit device. As will be readily apparent to those skilled in the art upon a complete reading of the present application, the present invention may be used in connection with the formation of a variety of different semiconductor devices. Moreover, the present invention may be employed with a variety of different technologies, e.g., 80-250 volt devices. Thus, the present invention should not be considered as limited to any particular type of device or other methodologies employed in forming such a semiconductor device unless such limitations are expressly set forth in the appended claims.

Figure 1:
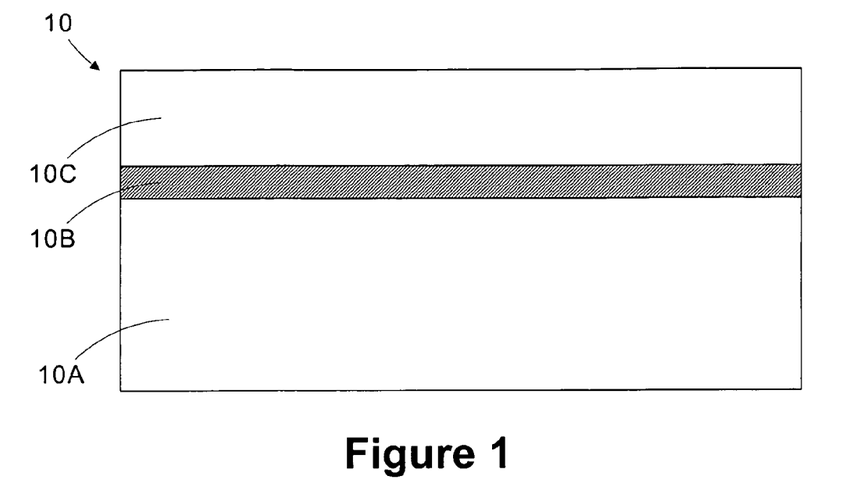
FIG. 1 depicts an illustrative silicon-on-insulator structure.

In general, the present invention is directed to various methods of forming a P-well region of a bi-polar transistor. FIG. 1 depicts an illustrative silicon-on-insulator (SOI) substrate 10 that will be used in forming the illustrative bi-polar transistor described herein. As shown therein, the SOI substrate 10 is comprised of a bulk substrate 10A, a buried insulation layer 10B (a so-called box layer) and an active layer 10C. The SOI substrate 10 depicted in FIG. 1 may be formed by a variety of known techniques and it may be comprised of a variety of materials. For example, in one illustrative embodiment, the bulk substrate 10A and active layer 10C are comprised of silicon and the buried insulation layer 10B is comprised of silicon dioxide. The active layer 10C may be doped with a variety of dopant materials. In the illustrative embodiment depicted herein, the active layer 10C may be doped with an N-type dopant material, e.g., phosphorous, such that the active layer 10C has a resistivity of approximately 1-4 ohms/cm. Although the illustrative substrate 10 described herein is a silicon-on-insulator substrate, the present invention is not limited to such a structure. For example, other semiconducting materials, such as germanium, may be employed with the present invention. Thus, the substrate structure should not be considered as limited to an active layer comprised of silicon unless such limitations are expressly set forth in the appended claims.

In general, various ion implantation processes will be performed to form various doped regions in the illustrative integrated circuit device described herein. In some cases, various process layers, e.g., pad oxide layers or the like, may be formed above the active layer 10C or other areas to be implanted prior to performing the implant processes described herein. The formation of such process layers is well known to those skilled in the art and thus will not be described in any further detail in the present application so as not to obscure the present invention.

FIGS. 2-5 describe an illustrative process sequence in which $N^+$ and $P^+$ buried layers will be formed in the active layer 10C. A variety of methodologies may be employed in forming such buried layers. The illustrative example depicted in FIGS. 2-5 should not be considered a limitation of the present invention unless such limitations are expressly set forth in the appended claims.

Figure 2:
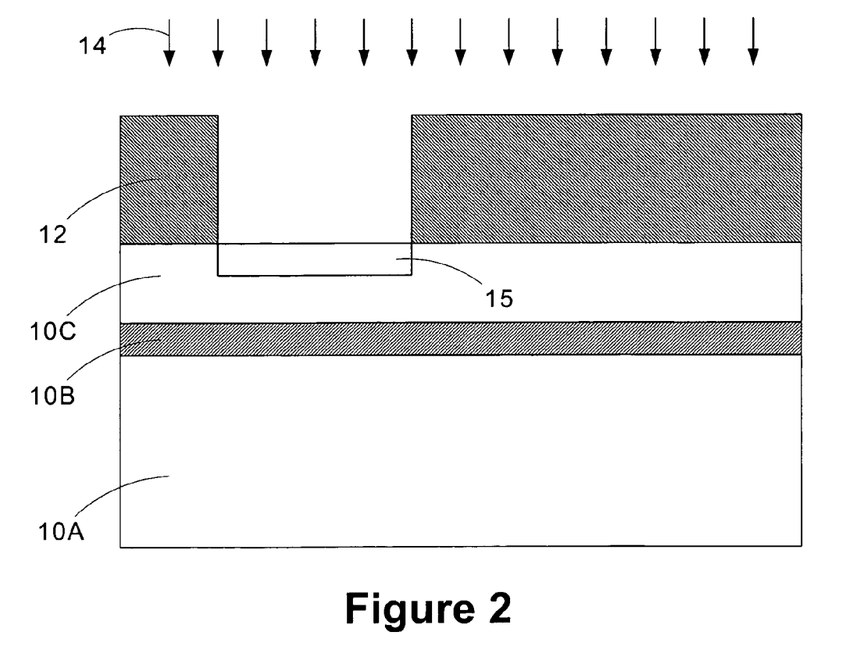
FIGS. 2 and 3 depict the formation of an illustrative N-doped buried layer in an active layer of the silicon-on-insulator structure.

With reference to FIG. 2, a patterned masking layer 12 comprised of, for example, photoresist material, is formed above the active layer 10C. Thereafter, an ion implantation process, as indicated by the arrows 14, is performed to form an N-type doped region 15 in the active layer 10C. A variety of dopant materials may be employed to form the N-type doped region 15, e.g., phosphorous, arsenic, etc. In one illustrative embodiment, the ion implantation process 14 is performed using antimony (Sb) as the dopant material at a dopant concentration of approximately $2\times10^{15}$ ions/cm$^2$ and at an energy level of approximately 80 keV. Thereafter, the patterned layer of photoresist 12 is removed. Thereafter, an anneal process is performed to activate and drive-in the doped region 15 such that it extends throughout the entire depth of the active layer 10C, as indicated in FIG. 3.

Figure 3:
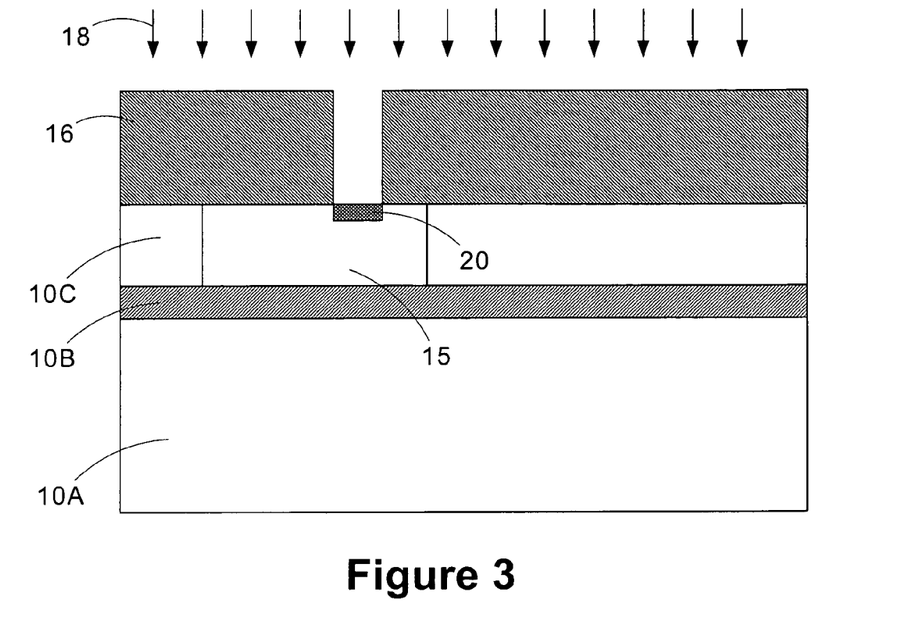

Next, as shown in FIG. 3, another patterned masking layer 16 is formed above the active layer 10C. Then, an ion implantation process, as indicated by the arrows 18, is performed to form an $N^+$ doped region 20 in the active layer 10C. A variety of dopant materials may be used to form the doped region 20. In one illustrative embodiment, the ion implantation process 18 is performed using phosphorous as the dopant material at a dopant dose of approximately $2\times10^{14}$ ions/cm$^2$ and at an implant energy level of approximately 100 keV. As will be recognized by those skilled in the art, the implant region 20 may be a so-called sinker implant. The purpose of the implant region 20 is to ensure good electrical contact with the doped region 15.

Figure 4:
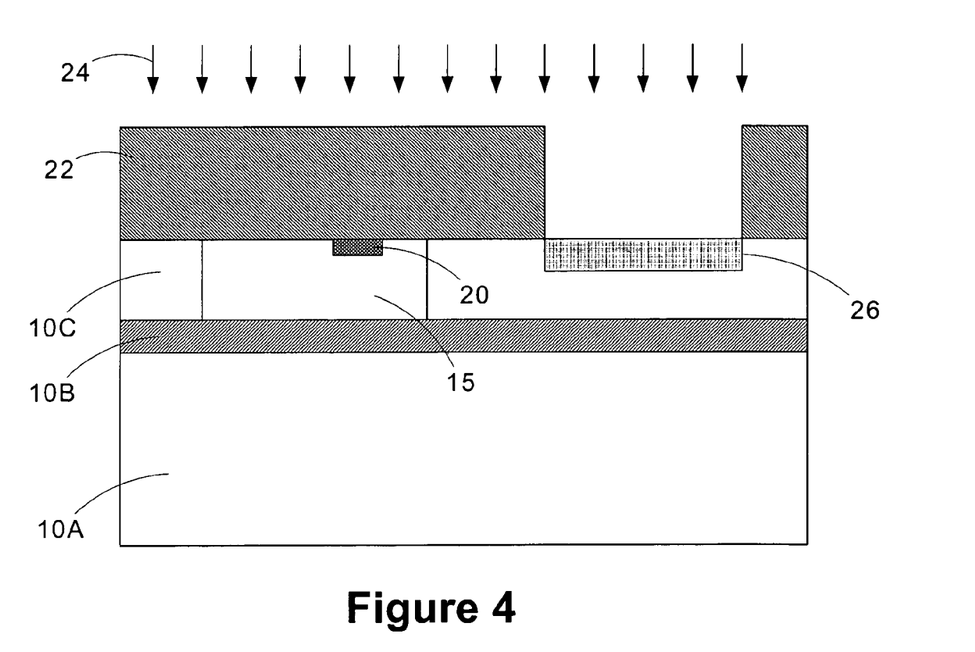
FIGS. 4 and 5 depict the formation of an illustrative P-doped buried layer in the active layer of the silicon-on-insulator structure.
Figure 5:
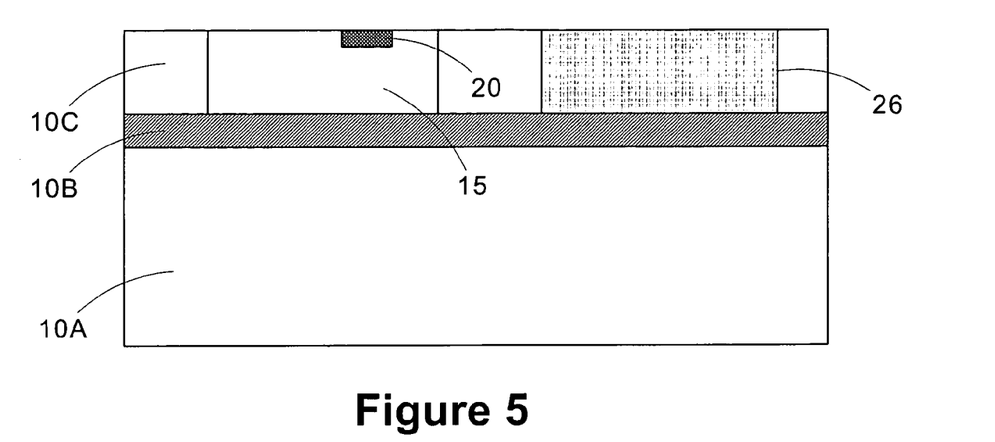

FIGS. 4 and 5 depict an illustrative process flow for forming a $P^+$ buried layer for the integrated circuit device described herein. As shown therein, after the masking layer 16 is removed, another patterned masking layer 22 is formed above the active layer 10C. Then, an ion implantation process, as indicated by the arrows 24, is performed to form a $P^+$ doped region 26 in the active layer 10C. The ion implantation process 24 may be performed with a variety of dopant materials. In one illustrative embodiment, the ion implantation process 24 is performed using boron at a dopant dose of approximately $7\times10^{14}$ ions/cm$^2$ and at an energy level of approximately 55 keV. FIG. 5 depicts the device after the masking layer 22 has been removed and an anneal process has been performed to drive-in the doped region 26.

Figure 6:
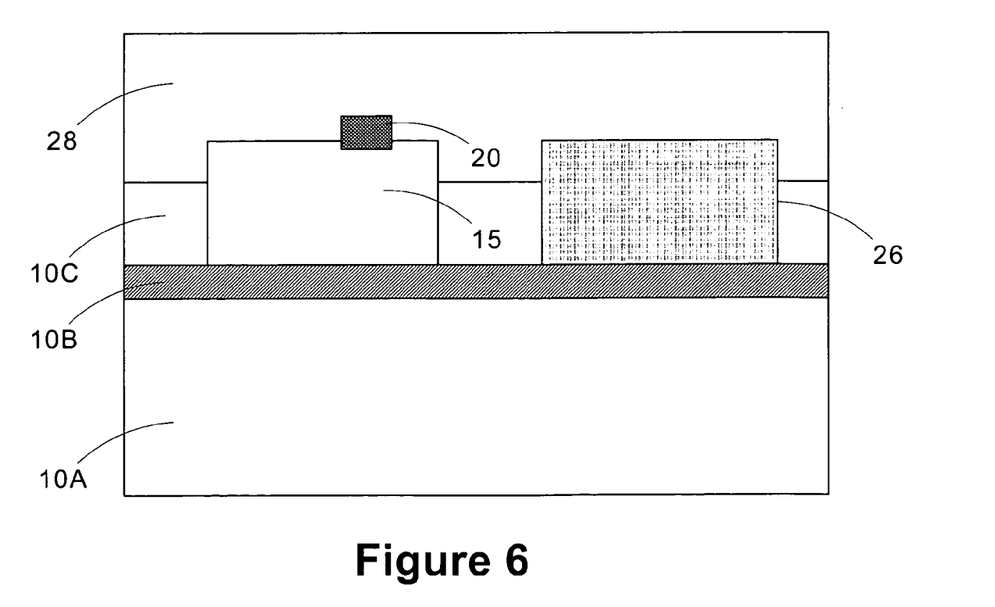
FIG. 6 depicts the formation of a first layer of epitaxial silicon on the structure depicted in FIG. 5.

Next, as indicated in FIG. 6, a first epitaxial silicon layer 28 is deposited above the active layer 10C. The first layer of epitaxial silicon 28 may be formed using a variety of known techniques and equipment. The first layer of epitaxial silicon 28 may be doped with an N-type dopant material, and it may have a resistivity of approximately 15 ohm-cm. The thickness of the first layer of epitaxial silicon 28 may vary depending upon the particular application. In one illustrative embodiment, intended for a device voltage level of approximately 150 volts, the first layer of epitaxial silicon 28 may have a thickness that ranges from approximately 12-18 microns. In one particularly illustrative embodiment, the first layer of epitaxial silicon 28 has a thickness of approximately 15 microns. Note that, during the process of forming the first layer of epitaxial silicon 28, the doped regions 15, 20 and 26 tend to migrate into the first layer of epitaxial silicon 28 due to the heat of the deposition process.

Figure 7:
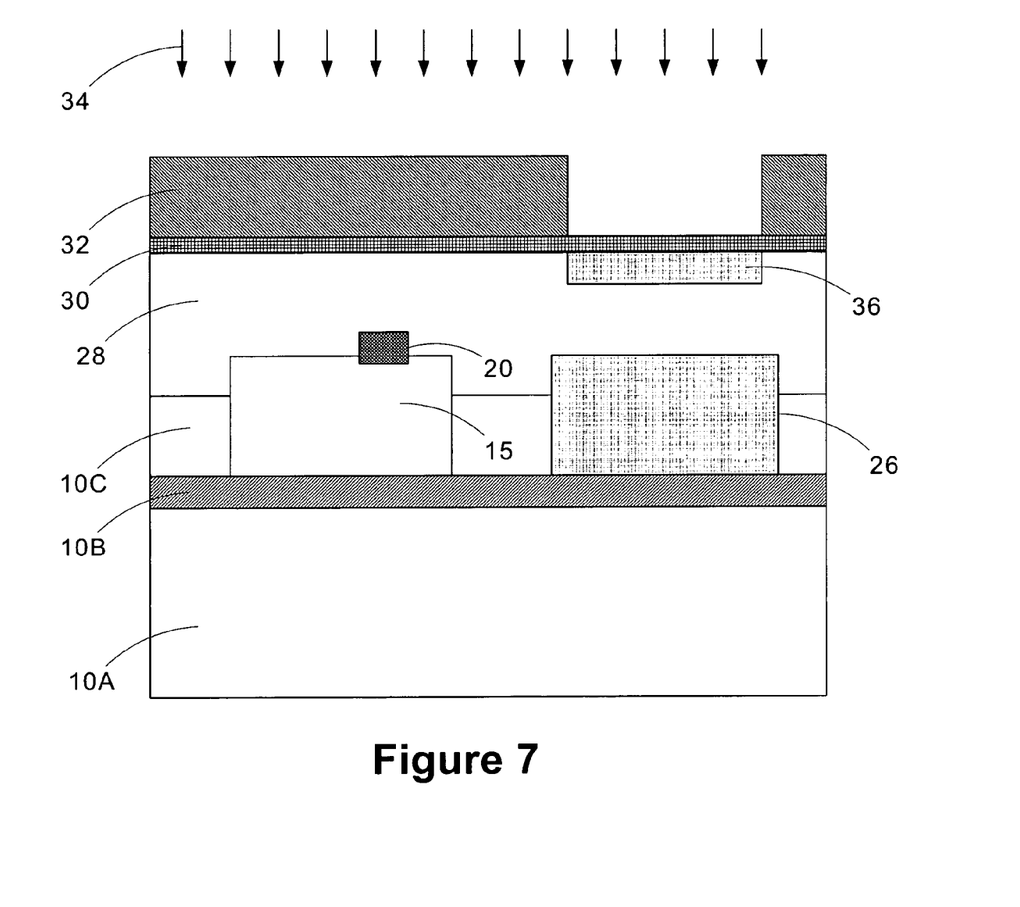
FIG. 7 depicts the formation of a first doped region in the first layer of epitaxial silicon.

Next, as shown in FIG. 7, a pad oxide layer 30 is formed above the first layer of epitaxial silicon 28. In one illustrative embodiment, the pad oxide layer 30 is comprised of a thermally grown layer of silicon dioxide having a thickness of approximately 100 nm. A patterned masking layer 32, comprised of, for example, photoresist, is then formed above the pad oxide layer 30. An ion implantation process, as indicated by the arrows 34, is then performed to form a first P-doped region 36 in the first layer of epitaxial silicon 28. A variety of dopant materials may be employed to form the doped region 36. In one illustrative embodiment, the P-doped region 36 is formed by implanting boron at a dopant dose of approximately $4 \times 10^{11}$-$8 \times 10^{11}$ ions/cm$^2$ and at an energy level of approximately 60-100 keV. In one particularly illustrative embodiment, the P-doped region 36 is formed by implanting boron at a dopant dose of approximately $5 \times 10^{11}$ ions/cm$^2$ and at an energy level of approximately 80 keV.

Figure 8:
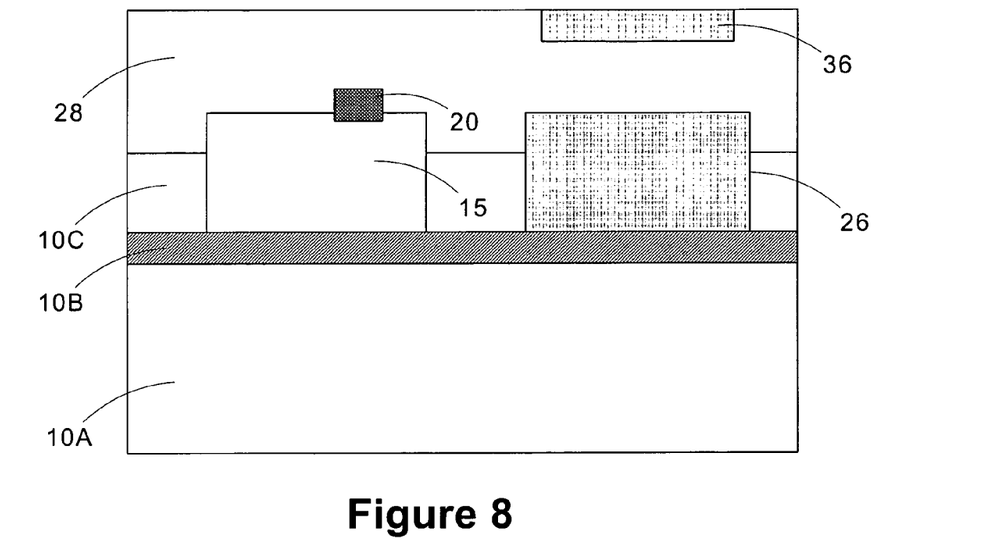
FIG. 8 depicts the structure of FIG. 7 after a layer of photoresist and a pad oxide layer have been removed.

Then, as indicated in FIG. 8, the patterned masking layer 32 and the pad oxide layer 30 are removed from above the first layer of epitaxial silicon 28 using a variety of known techniques. For example, the patterned masking layer 32 may be removed by performing a wet acid strip process or an ashing process. The pad oxide layer 30 may then be removed by performing a wet chemical etch process, as is well known to those skilled in the art.

Figure 9:
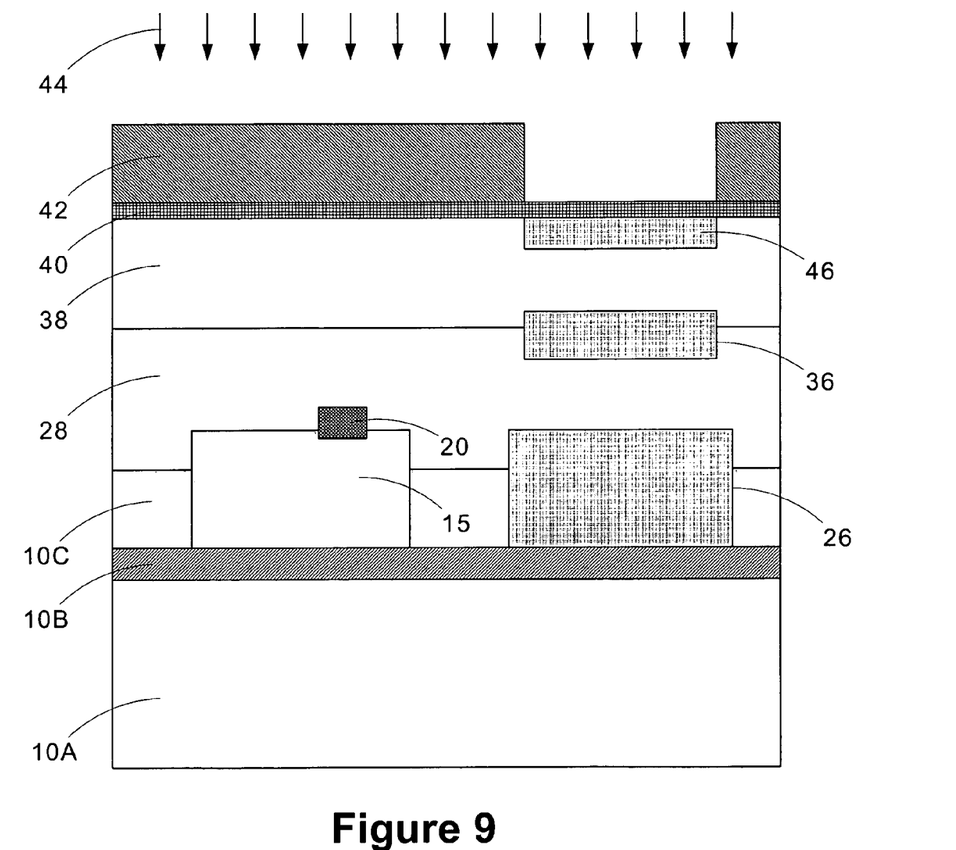
FIG. 9 depicts the formation of a second doped region in a second layer of epitaxial silicon.

As indicated in FIG. 9, the next process involves forming a second layer of epitaxial silicon 38 above the first layer of epitaxial silicon 28. The second layer of epitaxial silicon 38 may have a thickness that ranges from approximately 6-18 microns, and in one particularly illustrative embodiment, may have a thickness of approximately 9 microns. Note that, during the forming of the second layer of epitaxial silicon 38, the doped region 36 tends to migrate into the second layer of epitaxial silicon 38 due to the deposition temperature used in forming the second layer of epitaxial silicon 38. It should be understood that although the drawings depict the first and second layers of epitaxial silicon 28, 38, respectively, as discrete layers, in practice such individual discrete layers may not be readily identifiable in a completed device. That is, the first and second layers of epitaxial silicon 28, 38, respectively, tend to merge together so as to form a more or less monolithic structure of epitaxial silicon.

Next, as indicated in FIG. 9, another pad oxide layer 40 is formed above the second layer of epitaxial silicon 38. In one illustrative embodiment, the pad oxide layer 40 is comprised of a thermally grown layer of silicon dioxide having a thickness of approximately 100 nm. A patterned masking layer 42, e.g., photoresist, is then formed above the pad oxide layer 40 using known photolithography techniques. An ion implantation process, as indicated by the arrows 44, is then performed to form a second P-doped region 46 in the second layer of epitaxial silicon 38. The second P-doped region 46 may be formed form a variety of dopant materials. In one illustrative embodiment, the ion implantation process 44 is performed using boron at a dopant dose of approximately $4 \times 10^{11}$-$8 \times 10^{11}$ ions/cm$^2$ and at an energy level of approximately 60-100 keV. In one particularly illustrative embodiment, the P-doped region 46 is formed by implanting ions at a dopant dose of approximately $5 \times 10^{11}$ ions/cm$^2$ and at an energy level of approximately 80 keV. The patterned masking layer 42 and the pad oxide layer 40 may then be removed.

Figure 10:
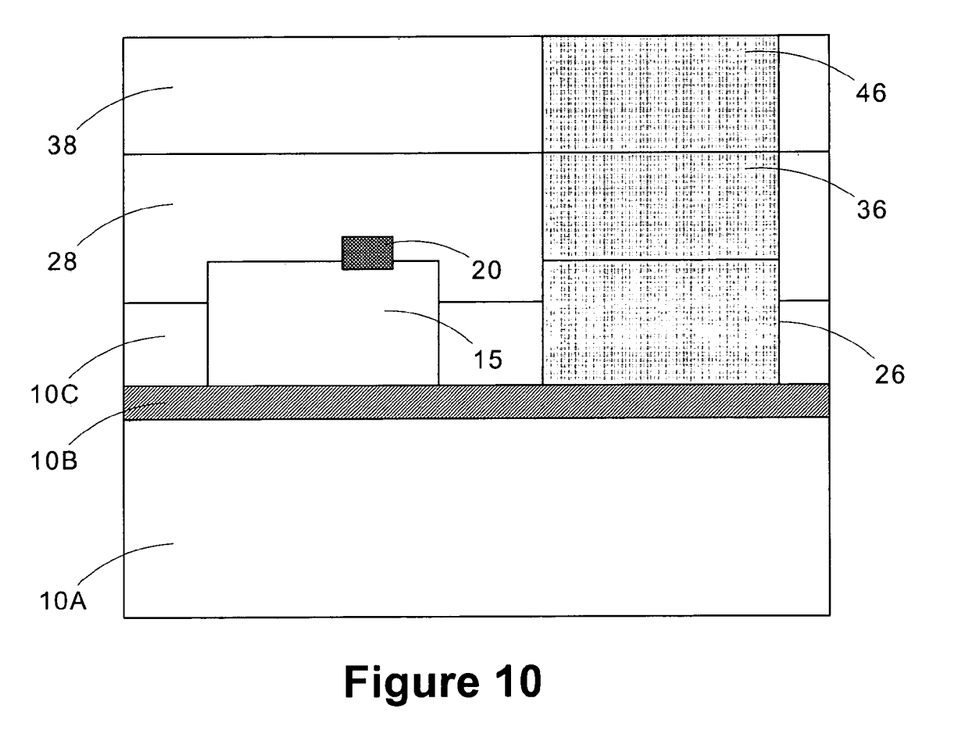
FIG. 10 depicts the structure of FIG. 9 after at least one heat treating process has been performed.

Ultimately, one or more heat treatment or anneal processes will be performed to drive the doped regions 46 and 36 to their final desired position within the device. In general, such anneal processes will be performed until the various doped regions 46, 36 and 26 engage one another so that the device may function for its intended purpose. FIG. 10 depicts the illustrative situation where the doped regions 46, 36 and 26 have been subjected to one or more anneal processes such that they contact one another. Of course, the depiction in FIG. 10 is schematic in nature, as will be recognized by those skilled in the art after a complete reading of the present application. Moreover, it should be understood that the various anneal processes used to drive the doped regions 46, 36 to their final desired location may be separate dedicated anneal processes performed solely for that purpose, or may be part of other heat treating processes performed on the integrated circuit device during the course of its manufacture.

Figure 11:
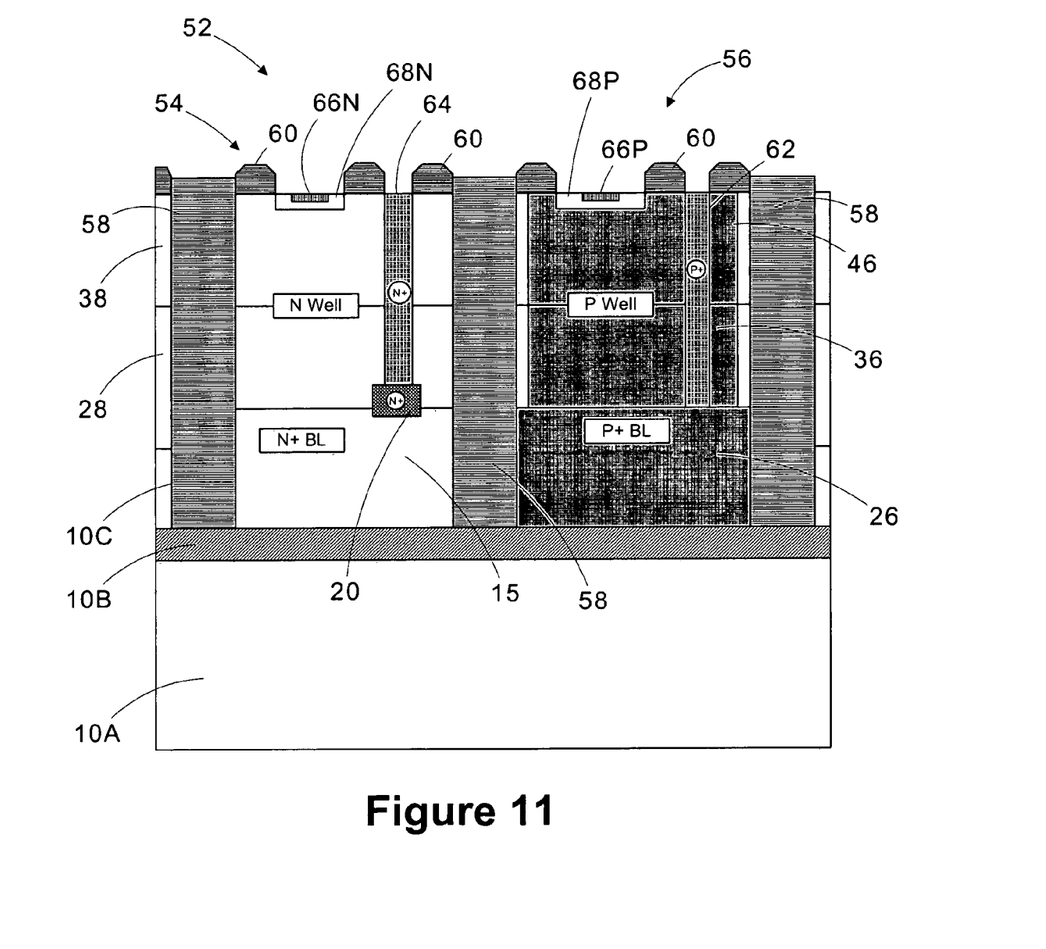
FIG. 11 depicts a portion of an illustrative integrated circuit device partially formed in accordance with the methods described herein.

FIG. 11 depicts an illustrative integrated circuit device 52 in which the present invention may be employed. More specifically, the integrated circuit device 52 may be a complementary bi-polar transistor device comprised of an NPN bi-polar transistor 54 and a PNP bi-polar transistor 56. The doped regions 36 and 46 define a P-well for the PNP transistor 56. The doped region 26 is the P$^+$ buried layer for the PNP transistor 56. Isolation regions 58 isolate the NPN transistor 54 from the PNP transistor 56. A contact 62 is provided to the P$^+$ buried layer 26 of the PNP transistor 56. Also depicted therein is an illustrative base region 68P and an emitter region 66P for the PNP transistor 56. The NPN transistor 54 is also comprised of a contact 64 that is coupled to the doped sinker region 20 and an N$^+$ buried layer 15. The NPN transistor 54 further comprises an emitter 66N and a base region 68N. As will be recognized by those skilled in the art, a plurality of conductive contacts and lines will be provided to connect the various components of the transistors 54, 56 depicted in FIG. 11. Such conductive contacts and lines are not depicted in FIG. 11 so as not to obscure the present invention.

Figure 12:
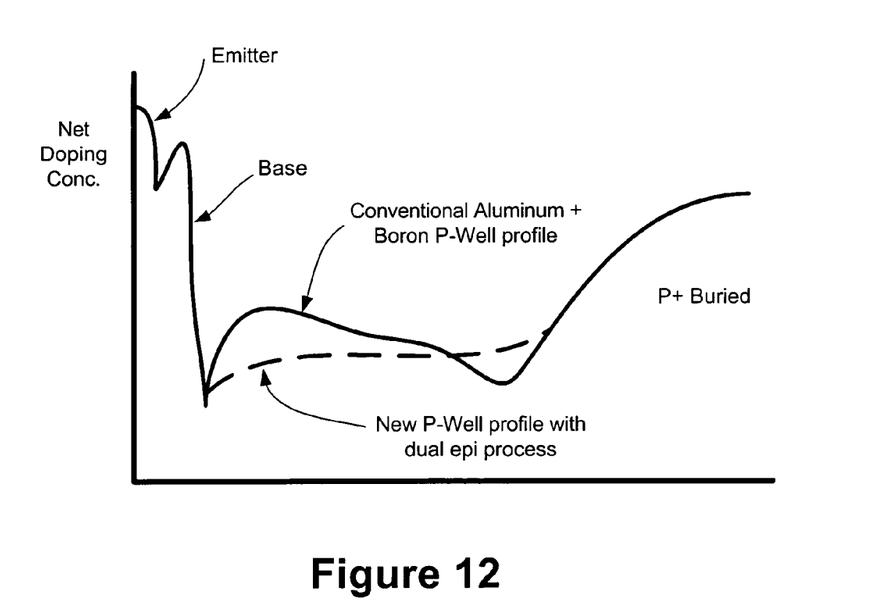
FIG. 12 is a graph depicting the dopant profile of a P-well junction formed in accordance with the present invention as compared to prior art techniques.

The present invention may prove beneficial in several respects. For example, forming the first and second epitaxial layers, and forming doped regions in each of the layers, allows the dopant profile in the final device to be more readily customized or tailored to a particular application. Simply put, the methodologies described herein allow an integrated circuit manufacturer more control of the dopant profile of the P-well in a PNP bi-polar transistor. Additionally, in some applications, the use of aluminum may be avoided thereby eliminating or reducing problems associated with leakage, equipment contamination and with variability of breakdown voltage, early voltage and quasi saturation. FIG. 12 is a chart depicting the simulated dopant profile of an illustrative P-well formed in accordance with one embodiment of the present invention as compared to the simulated dopant profile of a P-well formed in accordance with the prior art aluminum/boron two-step implant process. As indicated therein, the dual epi process described herein results in a P-well with a more consistent and uniform dopant concentration throughout its depth as compared to that of the prior art process.

The present invention is generally directed to various methods of forming a P-well in an integrated circuit device. In one illustrative embodiment, the method comprises forming a first layer of epitaxial material above an active layer of a substrate, forming a first doped region in the first layer of epitaxial material, forming a second layer of epitaxial material above the first layer of epitaxial material, forming a second doped region in the second layer of epitaxial material, and performing at least one heat treating process.

In another illustrative embodiment, the method comprises forming a first layer of epitaxial silicon above an active layer of a silicon-on-insulator structure, forming a first doped region in the first layer of epitaxial silicon, forming a second layer of epitaxial silicon above the first layer of epitaxial silicon, forming a second doped region in the second layer of epitaxial silicon, and performing at least one heat treating process.

In yet another illustrative embodiment, the method comprises forming a first layer of epitaxial silicon above an active layer of a silicon-on-insulator structure, performing a first ion implantation process to form a first doped region in the first layer of epitaxial silicon, forming a second layer of epitaxial silicon above the first layer of epitaxial silicon, performing a second ion implantation process to form a second doped region in the second layer of epitaxial silicon, and performing at least one heat treating process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a P-well region for a PNP bi-polar transistor, comprising:
    performing a first ion implantation process to form a first p-doped region in a portion of an active layer of a substrate to form a portion of a buried layer for the PNP transistor;
    forming a first layer of epitaxial material above said active layer;
    forming a second p-doped region in said first layer of epitaxial material;
    after forming said second p-doped region, forming a second layer of epitaxial material above said first layer of epitaxial material;
    after forming said second layer of epitaxial material, forming a third p-doped region in said second layer of epitaxial material; and
    after forming said third p-doped region, performing at least one heat treating process to cause said second and third p-doped regions to migrate toward one another and thereby define a portion of said P-well, wherein said at least one heat process is performed until said second and third p-doped regions engage one another and said second p-doped region engages said first p-doped region.

2. The method of claim 1, wherein said first and second layers of epitaxial material are comprised of at least one of silicon and germanium.

3. The method of claim 1, wherein said step of forming said second p-doped region comprises performing a second ion implantation process to form said second p-doped region.

4. The method of claim 3, wherein said step of forming said third p-doped region comprises performing a third ion implantation process to form said third p-doped region.

5. The method of claim 1, wherein said first layer of epitaxial material has a thickness of approximately 12-18 µm.

6. The method of claim 1, wherein said second layer of epitaxial material has a thickness of approximately 6-12 µm.

7. The method of claim 1, wherein said second p-doped region is comprised of boron.

8. The method of claim 1, wherein said third p-doped region is comprised of boron.

9. The method of claim 1, wherein said second p-doped region is formed by performing a second ion implantation process using boron at a dopant dose of approximately $4\times10^{11}$-$8\times10^{11}$ ions/cm$^2$ and at an implant energy of approximately 60-100 keV.

10. The method of claim 1, wherein said third p-doped region is formed by performing a third ion implantation process using boron at a dopant dose of approximately $4\times10^{11}$-$8\times10^{11}$ ions/cm$^2$ and at an implant energy of approximately 60-100 keV.

11. The method of claim 1, further comprising forming a first layer of silicon dioxide above said first layer of epitaxial material prior to forming said second p-doped region.

12. The method of claim 1, further comprising forming a second layer of silicon dioxide above said second layer of epitaxial material prior to forming said third p-doped region.

13. A method of forming a P-well region for a PNP bi-polar transistor, comprising:
    performing a first ion implantation process to form a first p-doped region in a portion of an active layer of a silicon-on-insulator structure to form a portion of a buried layer for the PNP transistor;
    forming a first layer of epitaxial silicon above said active layer;
    forming a second p-doped region in said first layer of epitaxial silicon;
    after forming said second p-doped region, forming a second layer of epitaxial silicon above said first layer of epitaxial silicon;
    after forming said second layer of epitaxial material, forming a third p-doped region in said second layer of epitaxial silicon; and
    after forming said third p-doped region, performing at least one heat treating process to cause said second and third p-doped regions to migrate toward one another and thereby define a portion of said P-well, wherein said at least one heat process is performed until said second and third p-doped regions engage one another and said second p-doped region engages said first p-doped region.

14. The method of claim 13, wherein said step of forming said second p-doped region comprises performing a second ion implantation process to form said second p-doped region.

15. The method of claim 14, wherein said step of forming said third p-doped region comprises performing a third ion implantation process to form said third p-doped region.

16. The method of claim 13, wherein said first layer of epitaxial silicon has a thickness of approximately 12-18 µm.

17. The method of claim 13, wherein said second layer of epitaxial silicon has a thickness of approximately 6-12 µm.

18. The method of claim 13, wherein said second p-doped region is formed by performing a second ion implantation process using boron at a dopant dose of approximately $4\times10^{11}$-$8\times10^{11}$ ions/cm$^2$ and at an implant energy of approximately 60-100 keV.

19. The method of claim 18, wherein said third p-doped region is formed by performing a third ion implantation process using boron at a dopant dose of approximately $4\times10^{11}$-$8\times10^{11}$ ions/cm$^2$ and at an implant energy of approximately 60-100 keV.

20. The method of claim 13, further comprising forming a first layer of silicon dioxide above said first layer of epitaxial silicon prior to forming said second p-doped region.

21. The method of claim 13, further comprising forming a second layer of silicon dioxide above said second layer of epitaxial silicon prior to forming said third p-doped region.

22. A method of forming a P-well region for a PNP bi-polar transistor, comprising:

performing a first ion implantation process to form a first p-doped region in a portion of an active layer of a silicon-on-insulator structure to form a portion of a buried layer for the PNP transistor;

forming a first layer of epitaxial silicon above said active layer, said first layer of epitaxial silicon having a thickness of approximately 12-18 μm;

performing a second ion implantation process to form a second p-doped region in said first layer of epitaxial silicon;

after forming said second p-doped region, forming a second layer of epitaxial silicon above said first layer of epitaxial silicon, said second layer of epitaxial silicon having a thickness of approximately 6-12 μm;

after forming said second layer of epitaxial material, performing a third ion implantation process to form a third p-doped region in said second layer of epitaxial silicon; and after forming said third p-doped region, performing at least one heat treating process to cause said second and third p-doped regions to migrate toward one another and thereby define a portion of said P-well, wherein said at least one heat process is performed until said second and third p-doped regions engage one another and said second p-doped region engages said first p-doped region.

23. The method of claim 22, wherein said second ion implantation process is performed using boron at a dopant dose of approximately $5\times10^{11}$ ions/cm$^2$ and at an implant energy of approximately 80 keV.

24. The method of claim 22, wherein said third ion implantation process is performed using boron at a dopant dose of approximately $5\times10^{11}$ ions/cm$^2$ and at an implant energy of approximately 80 keV.

25. The method of claim 22, further comprising forming a first layer of silicon dioxide above said first layer of epitaxial silicon prior to forming said second p-doped region.

26. The method of claim 22, further comprising forming a second layer of silicon dioxide above said second layer of epitaxial silicon prior to forming said third p-doped region.

* * * * *